US 6,556,451 B1

(12) United States Patent  
Feightner et al.

(10) Patent No.: US 6,556,451 B1
(45) Date of Patent: Apr. 29, 2003

(54) ADJUSTABLE GUIDE MECHANISM FOR COMPUTER ADD IN CARD RETENTION

(75) Inventors: Ricky R. Feightner, West Linn, OR (US); Thomas A. Boyd, Battle Ground, WA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/539,367

(22) Filed: Mar. 31, 2000

(51) Int. Cl.[7] ................................................ H05K 5/00
(52) U.S. Cl. .................. 361/756; 361/727; 361/683; 361/752; 361/753; 361/759; 361/801; 361/802; 361/825; 361/747; 361/796; 439/62; 439/160
(58) Field of Search ........................ 361/756, 752–753, 361/759, 802, 726, 727, 732, 741, 747, 683, 801, 737, 796, 825; 439/62, 160

(56) References Cited

U.S. PATENT DOCUMENTS 5,594,627 A * 1/1997 Le .............................. 361/801
5,868,585 A * 2/1999 Barthel et al. ............... 439/377
6,021,049 A * 2/2000 Thompson et al. .......... 361/759
6,128,196 A * 10/2000 Hoyle, Jr. et al. ........... 361/752
6,145,190 A * 11/2000 Shin et al. ...................... 29/840

* cited by examiner

Primary Examiner—David Martin
Assistant Examiner—Thanh Yen Tran
(74) Attorney, Agent, or Firm—Marger Johnson & McCollom, PC

(57) ABSTRACT

A card guide apparatus for retaining a PCI or ISA computer add-on card within a computer chassis frame. The card guide includes a bracket fixed to the computer chassis frame and a shuttle that is moveable between a first position disengaged with edges of the card to a second position engaged with the edges of the card for support during transport. The shuttle is slidably retained along at least one track defined within the bracket and includes an upper and lower panel defining a channel therebetween in which the card edge is received.

18 Claims, 5 Drawing Sheets

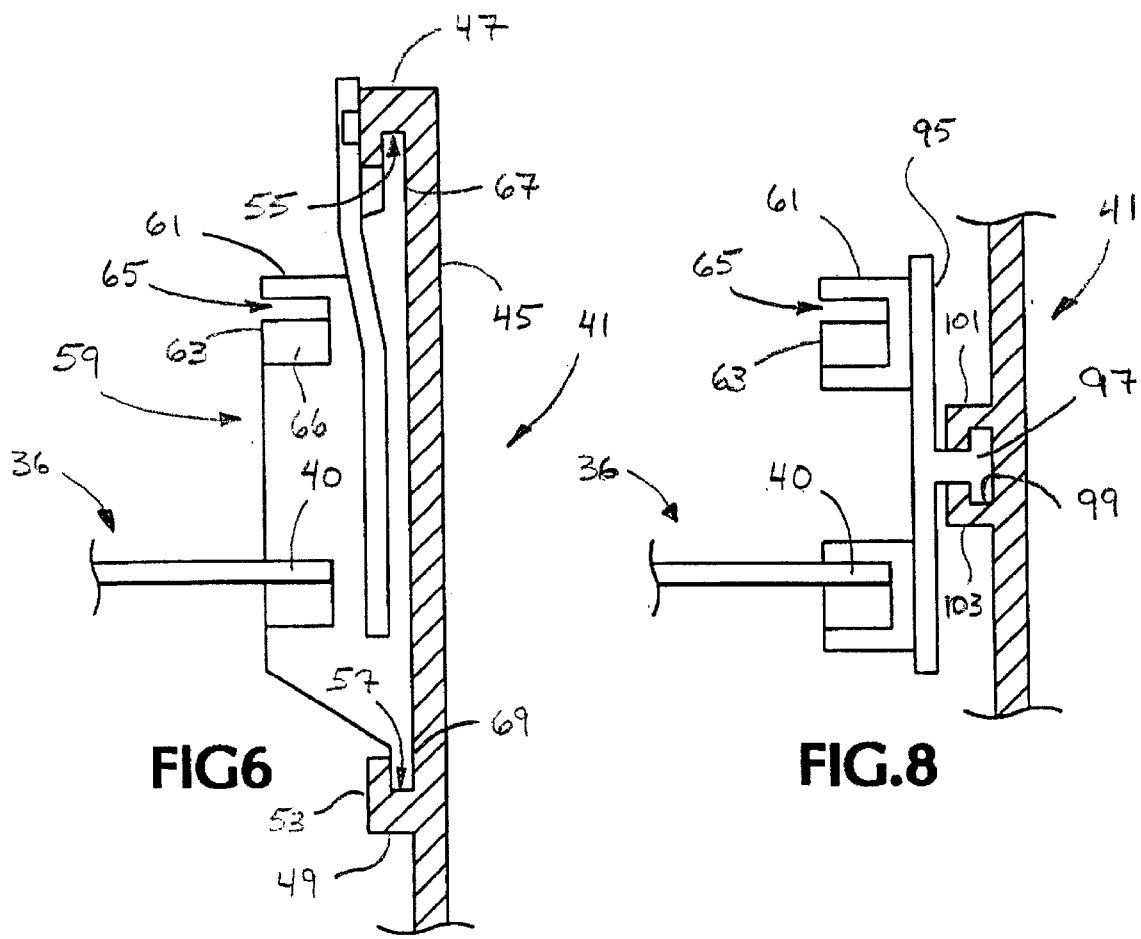
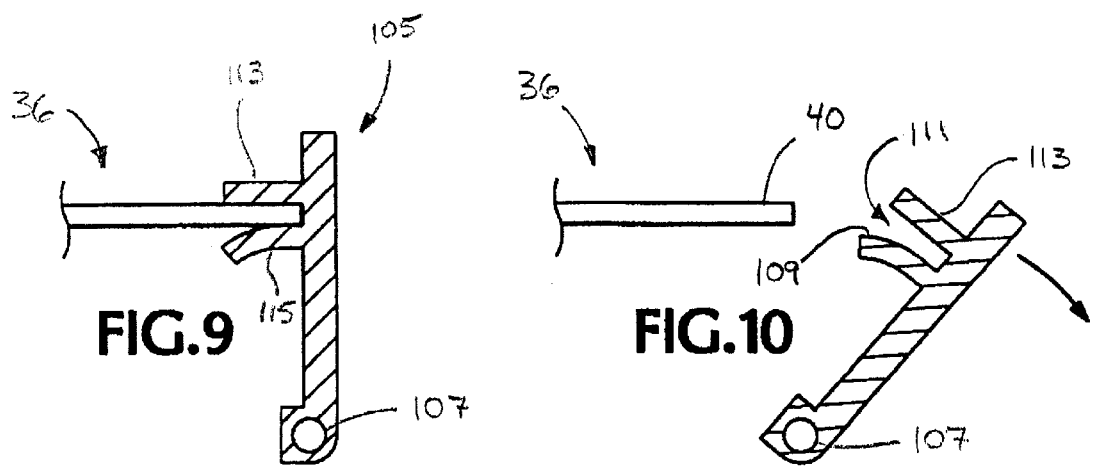

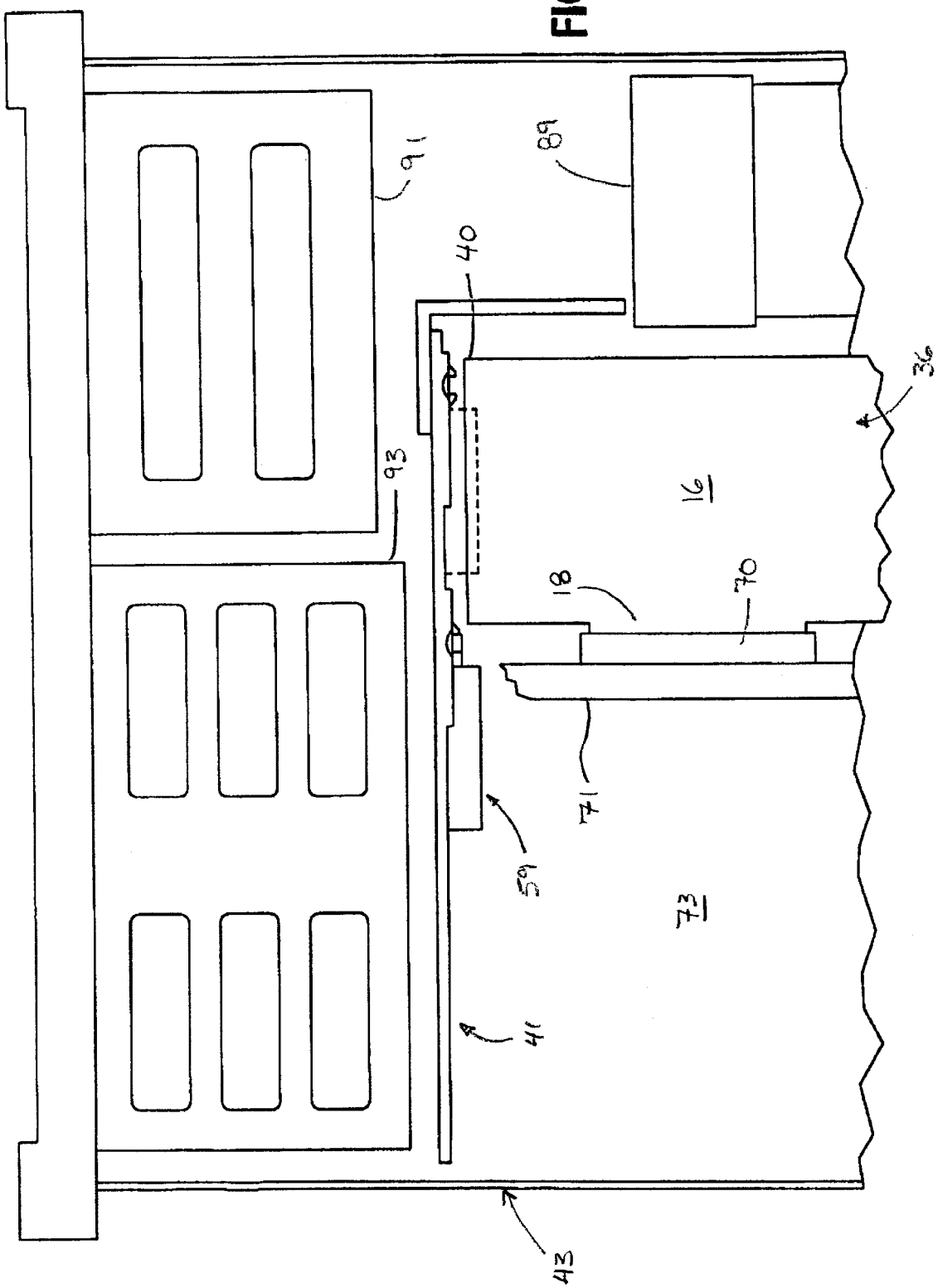

ADJUSTABLE GUIDE MECHANISM FOR COMPUTER ADD IN CARD RETENTION

BACKGROUND OF THE INVENTION

This invention relates generally to mechanical connectors for computer cards and in particular to a mechanism for securing PCI, ISA or similar adapter cards to the frame of a computer.

Many computers utilize Peripheral Component Interconnect (PCI) or Industry Standard Architecture (ISA) adapter cards. These cards have electrical connectors along their longitudinal edges and are mounted to the frame of the computer chassis housing along their forward and rearward edges. During shipping, the PCI or ISA adapter cards must be secured from movement to prevent them from electrically disconnecting from the connector on the motherboard or a riser card.

Currently, each full length PCI or ISA adapter card is mounted to the frame of the computer chassis housing by laterally sliding a forward edge of the card into a fixed card guide channel formed within the frame. A PCI card is slightly shorter in length than an ISA adapter card and requires a card extender bracket to be mounted to its forward edge to reach and properly engage the card guide channel. Once inserted, the electrical connectors of the card can then engage respective connectors on the riser card mounted to the computer's motherboard. A back bracket is mounted to the rearward edge of the card. After the card is positioned within the card guide channel, a screw is inserted through the back bracket and fastened to the computer frame to rigidly hold the rearward edge of the card in position. Insertion of the card in this way requires that there be an open space within the computer frame approximately twice the width of the computer card so that the card can be lowered into the computer frame laterally adjacent the channel and slid sideways into the channel.

A modified approach to secure computer cards to the frame of a computer chassis housing is described in U.S. Pat. No. 6,021,049 to Thompson et al. The card retention device described within the Thompson et al. patent includes a ratcheting mechanism within the card guide channel that engages complimentary surfaces formed on the edge of the computer card. Such a system requires that the engaged edge of the computer card or card extender bracket include specially grooved surfaces—a non-standard component of most cards. More importantly, however, such a system still requires that there be enough open space within the computer frame to allow the card to be lowered within the case and slid sideways so that a forward edge of the card is received within the channel. This creates a problem in computer case design since the trend is to reduce the size of the computer chassis housing by increasing the density of the components (hard drives, power supplies, and other devices and cards) within the housing. Presently, manufacturers have been unsuccessful in designing an alternative card retention mechanism that frees up this extra space for other uses. Accordingly, a need remains for card retention device that addresses this drawback in the prior art.

SUMMARY OF THE INVENTION

Instead of inserting the card within a fixed retention mechanism as in the prior art, the present invention generally includes a card guide that is moveable between a first position disengaged with the card and a second position engaged with the card.

A card guide apparatus constructed according to one embodiment of the invention includes a bracket fixed to the computer chassis frame and a shuttle that is moveable between a first position disengaged with edges of the card to a second position engaged with the edges of the card for support during transport. The shuttle is slidably retained along at least one track defined within the bracket and includes an upper and lower panel defining a channel therebetween in which the card edge is received.

In another embodiment of the invention, the card guide apparatus includes a wall having upper and lower panels that define a channel therebetween. Instead of sliding parallel to an edge of the card, however, the wall is pivotally attached to the frame so that it rotates the channel between an engaged position and unengaged positioned.

The foregoing and other objects, features and advantages of the invention will become more readily apparent from the following detailed description of a preferred embodiment of the invention that proceeds with reference to the accompanying drawings.

BRIEF DESCRIPTION OF THE DRAWINGS

FIG. 6 is an enlarged sectional end view of the apparatus and card of FIG. 5.

FIG. 7 is a top plan view of a computer chassis housing incorporating the apparatus and card of FIG. 4.

FIG. 8 is a sectioned schematic isometric view of an apparatus and card according to a second embodiment of the invention.

FIG. 9 is an enlarged sectional end view of an apparatus constructed according to a third embodiment of the invention shown in engagement with the card of FIG. 3.

FIG. 10 is an enlarged sectional end view of the apparatus of FIG. 8 shown in a disengaged position with respect to the card.

DETAILED DESCRIPTION

Figure 1:
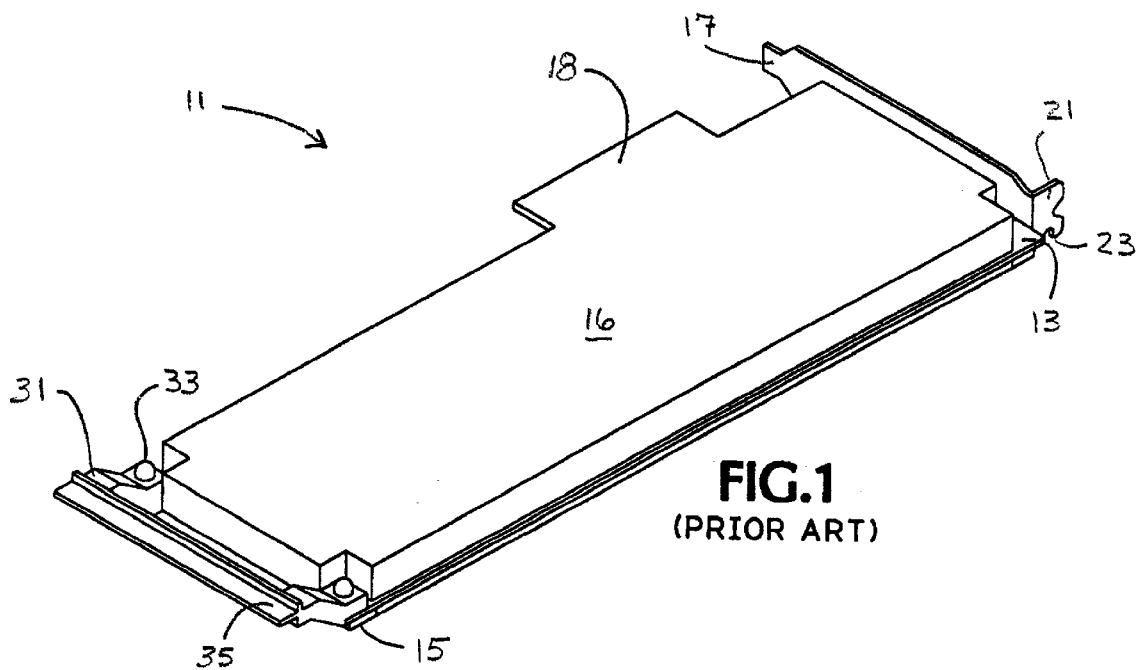
FIG. 1 is a schematic isometric view of a prior art PCI card with extender bracket.
Figure 2:
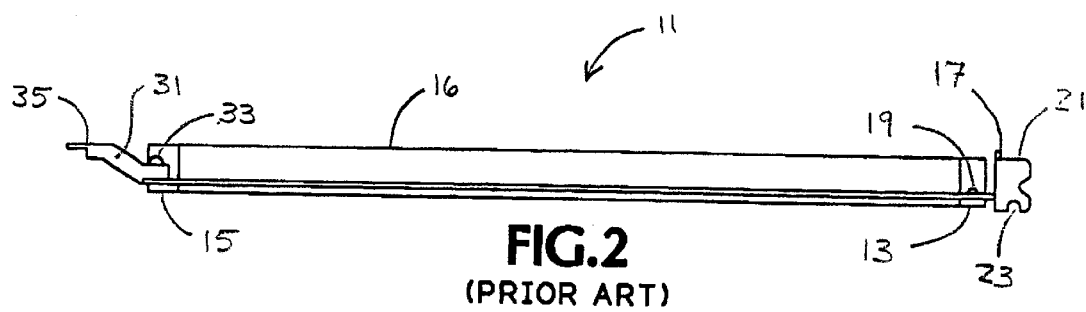
FIG. 2 is an elevated side view of the PCI card of FIG. 1.

Referring to FIGS. 1 and 2, a conventional, generally rectangular Peripheral Component Interconnect (PCI) card 11 having a rearward end 13 and a forward end 15 is shown. Electrical components (not shown) are mounted to a surface 16 of PCI card 11. PCI card 11 also has an electrical connector 18 along a longitudinal edge for engaging a complimentary motherboard connector. A back bracket 17 is rigidly mounted to rearward end 13 with fasteners 19 (FIG. 2). Back bracket 17 is provided for mounting rearward end 13 to a computer frame (not shown). Back bracket 17 is generally flat in shape and slightly longer than PCI card 11 is wide. Back bracket 17 has a short, rearward extending tab 21 protruding from one end and a screw attachment slot 23 on a lower edge of tab 21. Back bracket 17 is provided for attaching PCI card 11 to the computer frame (not shown).

A card extension bracket 31 is rigidly mounted to forward end 15 of a full length PCI card 11 with fasteners 33. Card extension bracket 31 is provided for adapting the length of PCI card 11 to conventional computer architectural requirements. Card extension bracket 31 inclines upward from a lower side of forward end 15 and is approximately equal in length to the width of PCI card 11. Card extension bracket 31 has a forward edge 35 protruding from its forward end. Forward edge 35 is a short, thin, flat strip that is generally parallel to PCI card 11.

Figure 3:
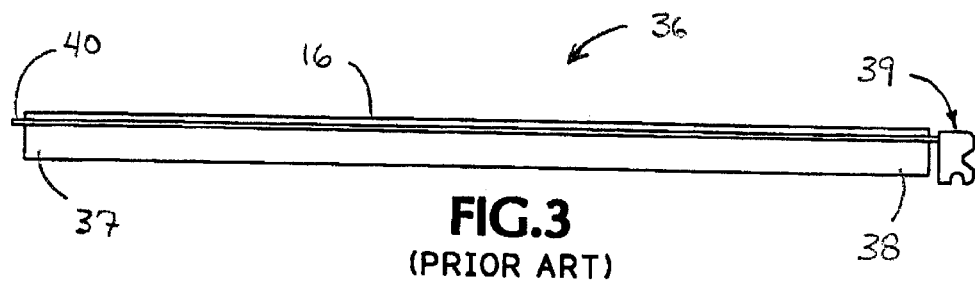
FIG. 3 is an elevated side view of a prior art ISA adapter card.

Referring to FIG. 3, a conventional, generally rectangular Industry Standard Architecture (ISA) card 36 is shown. ISA card 36 is very similar to PCI card 11 and has forward and rearward ends 37, 38 with a back bracket 39 rigidly mounted to rearward end 38. ISA card 36 also has an electrical connector 34 on a longitudinal edge and electrical components (not shown) mounted to its surface. A full length ISA card 36 is slightly longer than PCI card 11 and, thus does not require card extension bracket 31 (FIGS. 1 and 2) to fit conventional computer architectural requirements. ISA card 36 has a forward edge 40 protruding from its forward end. Forward edge 40 is essentially identical to forward edge 35 on PCI card 11.

Figure 4:
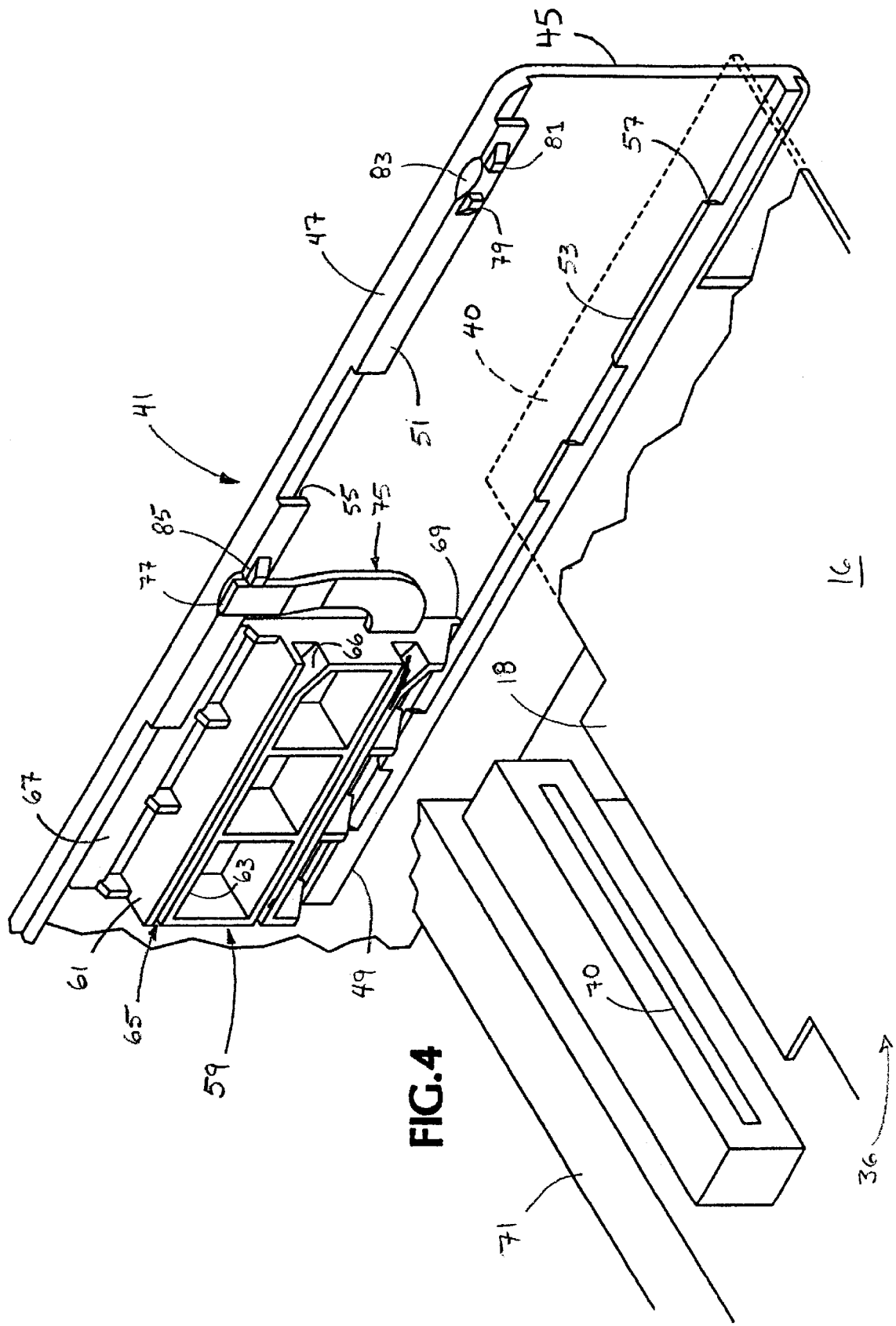
FIG. 4 is a schematic isometric view of an apparatus constructed in accordance with a first embodiment of the invention shown in a disengaged position with respect to the ISA card of FIG. 3.
Figure 5:
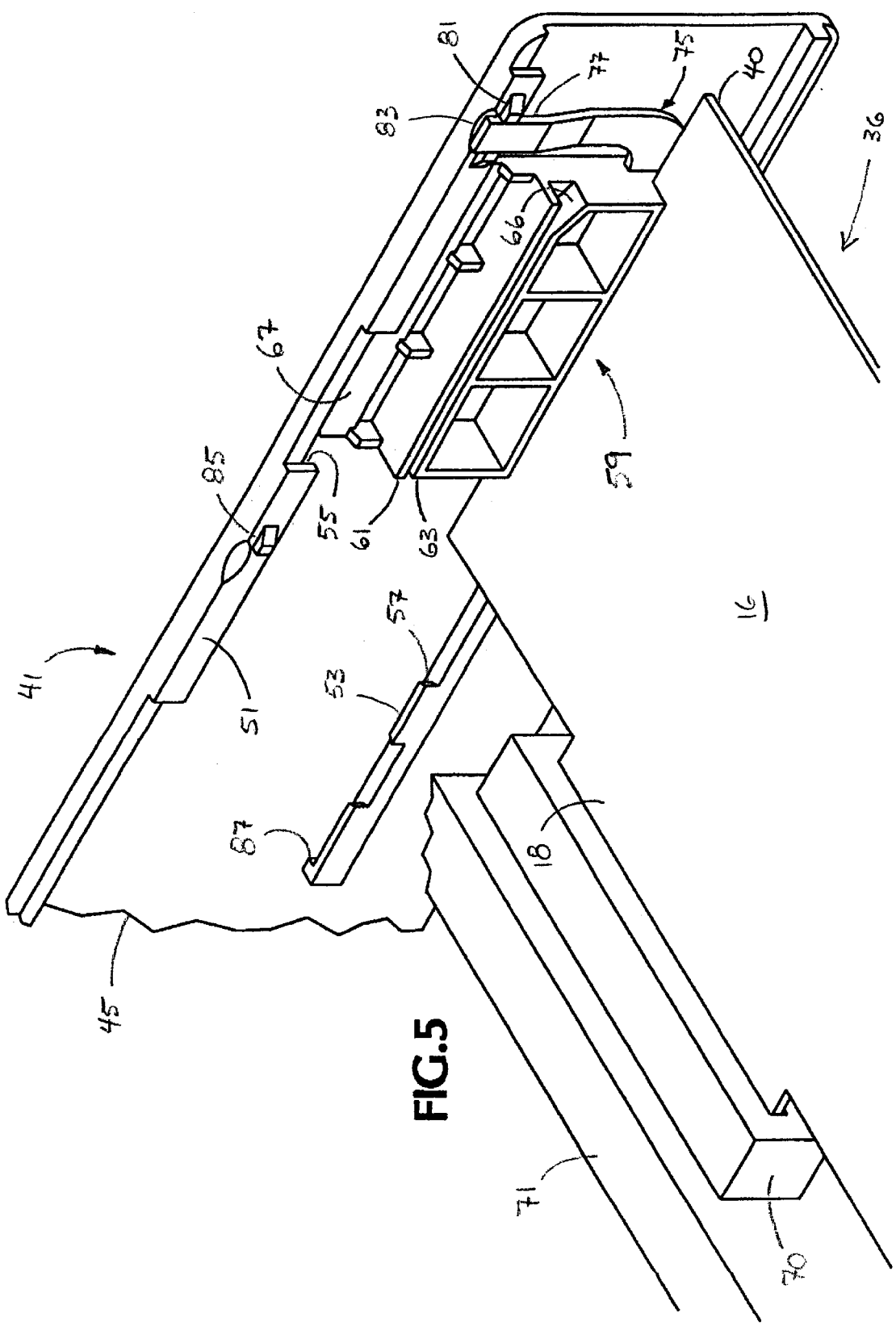
FIG. 5 is a schematic isometric view of the apparatus and card of FIG. 4 with the apparatus shown in an engaged position with the card.

Referring now to FIGS. 4–6, a first and preferred embodiment of the invention is shown. A retention bracket 41 is rigidly mounted to the frame 43 (FIG. 7) of a computer adjacent and in substantially parallel relation to the forward edge 40 of ISA card 36. Bracket 41 includes a back wall 45, top and bottom edges 47, 49. Lips or protrusions, such as lips 51 and 53, fold inward from top and bottom edges 47, 49, respectively, thereby forming grooves or tracks 55, 57 running a substantial length of bracket 41. First and second tracks 55, 57 are fixed to bracket 41, and thus the computer chassis frame 43, is substantially parallel relation to each other.

A shuttle 59, slidingly mounted to bracket 41, includes at least one set of upper and lower panels, such as panels 61 and 63, that define a channel 65 for receiving the sides and the forward edge 40 of card 36. The lower panel 63 includes a guiding surface 66 formed at an oblique angle with respect to said upper panel 63 so that the forward edge 40 of card 36 is more easily guiding into channel 65 as the shuttle is moved into an engaged position, as shown in FIG. 5. The shuttle in FIGS. 4–6 is shown with two sets of panels, the second being identical to the first, so that a total of two cards can be retained in parallel relationship to each other. It is understood, of course, that additional sets of panels can be incorporated within the shuttle to receive still more cards and the present invention should not be limited to one or two sets. Shuttle 59 further includes upper and lower shoulders 67, 69, that are adapted to be received within and slide along first and second tracks 55, 57, respectively, from a disengaged position (shown in FIG. 4) to an engaged position (shown in FIG. 5). The interactions of shoulders 67, 69 with respective tracks 55, 57 is best shown in FIG. 6.

The card guide constructed to a first embodiment of the invention further includes locking means for releasably retaining shuttle 59 in either the disengaged position or the engaged position. This feature is important for retaining the shuttle in its desired position. When retained by the locking means in the engage position, the shuttle is prevented from sliding along the tracks during shipment. When retained by the locking means in the disengaged position, the shuttle is moved out of the way and is prevented from interfering with the insertion of the card within the computer. Card 36 is then installed within the computer so that the electrical connector 18 of the card is inserted within a complementary electrical connection 70 of a riser card 71 attached to the computer motherboard 73 (FIG. 7).

The locking means includes in a preferred embodiment an arm 75 attached to shuttle 59 having an end 77 biased against an outside surface of track 55, as against lip 51. Tabs 79, 81 formed on lip 51 bridge across a depression 83 and form a slot therebetween for receiving arm end 77 when the shuttle is moved to an engaged position with the card (FIG. 5). Tabs 79, 81 include angled surfaces outside of the slot for guiding the arm end 77 into the slot and flat surfaces facing inward of the slot for retaining the arm end within the slot. Depression 83 is shaped and sized to allow one to insert an index finger behind the arm end 77 and lift it up and over the tab flat inward sides so that shuttle 59 can be moved along tracks 55, 57 between the first and second retained positions. The card is retained in the disengaged position (FIG. 4) by tab 85, which prevents shuttle 59 from moving toward the engaged position. In the embodiment shown in FIGS. 4–5, the complementary tab to tab 85 is unnecessary since the shuttle is prevented from moving further left by track stop 87 against shoulder 69. The cooperation of tab 85 with track stop 87 effectively forms a slot that retains arm end 77 in place and adjacent tab 85.

In operation, the card 36 is lowered adjacent the riser card 71 and the electrical connector 18 slid into the slot containing complementary electrical connections 70. The back bracket 39 (FIG. 3) of the card is inserted within a slot at the back of a computer chassis and a screw is inserted through the back bracket and fastened to the computer frame to rigidly hold the rearward edge of the card in position. During initial insertion of the card, the shuttle 59 is moved along the tracks of bracket 41 and locked in the disengaged position as shown in FIGS. 4 and 7. In this position, the panels of the shuttle are moved out of the way, thus avoiding impact with the forward edge 40 of the card 36 as card is installed within computer chassis frame 43. Once the card is engaged with the riser card 71, the shuttle 59 is moved along the tracks to an engaged position, thereby engaging the front edge of the card 36 as shown in FIG. 5 and by the dashed outline in FIG. 7.

Chassis form factors have been standardized in some cases so that certain types of equipment can be mounted within standard rack systems. The fixed width in the chassis, however, often does not provide sufficient clearance to remove the full length add in card and disengage it from the rear card guide, even when certain components are moved to other locations within the chassis.

FIG. 7 illustrates the arrangement of components within a typical rack-mounted server chassis frame 43. Cards 36 are installed in a riser card 71 which itself is coupled to motherboard 73. The chassis includes a power supply 89, floppy drive or other peripheral component 91 and hard drives 93. The arrangement of the components within frame 43 is such that no room exists for the card to be installed according to methods known in the prior art. The present invention, therefore, offers an improvement over the prior art because it allows the card guide support mechanism to be moved into place against a stationary card, rather than the other way around. Accordingly, the space within a chassis frame can be conserved and the components can be arranged more efficiently.

FIG. 8 illustrates an alternate arrangement of the sliding card guide described above. The card guide includes a wall 95 having at least one set of panels 61, 63 defining a channel 65 therebetween for receiving the front edge 40 or sides of card 36. A T-shaped projection 97 extends from the back end of wall 95 and is received within a single channel or track 99 formed by folded lips 101, 103. The card of FIG. 8 slides between disengaged and engaged positions along track 99 similar to the embodiment shown in FIGS. 4–6.

FIGS. 9 and 10 illustrate an alternate embodiment of the invention in which the card guide wall 105, pivotally attached to the computer enclosure frame 43, rotates around pivot 107 between an engaged position with card 36 (FIG. 9) to a disengaged position (FIG. 10). The card is guided into engaged position by oblique guiding surface 109 and received within a channel 111 formed between panels 113, 115 as with the prior embodiments.

Having described and illustrated the principles of the invention in a preferred embodiment thereof, it should be apparent that the invention can be modified in arrangement and detail without departing from such principles. Although the embodiments shown and described herein are arranged to receive and retain the front edges of computer add-in cards, it is understood that such embodiments can be modified so that the card guide slides substantially parallel to a longitudinal axis of the card and thereby engages the card sides. Accordingly, we claim all modifications and variation coming within the spirit and scope of the following claims.

What is claimed is:

1. An apparatus for retaining a card in a computer having a frame, the card having an electrical connector for engaging a motherboard connector in the computer, the card also having two oppositely facing sides and a first edge, the apparatus comprising a card guide having an upper panel and a lower panel which define a channel therebetween for receiving the first edge of the card, the channel moveable in a direction parallel to the first edge between a first position disengaged with the card to a second position engaged with the card.

2. The apparatus of claim 1 wherein the card guide includes:
    a first track fixed to the frame and running substantially parallel to the first edge of the card; and
    a shuttle having an upper panel and a lower panel which define a channel therebetween for receiving the sides and the first edge of the card, and a shoulder slidingly engaged with said first track for guiding the shuttle along a length of the first track between said first position and said second position.

3. The apparatus of claim 2 wherein said lower panel includes a guiding surface formed at an oblique angle with respect to said upper panel.

4. The apparatus of claim 2, further including a second track fixed to the frame in substantially parallel relation to said first track, said shuttle including a second shoulder slidingly engaged with said second track.

5. The apparatus of claim 4, further including locking means for releasably retaining said shuttle in either the first position or the second position along the first track, said locking means including:
    a first slot and a second slot spaced apart along the length of the first track; and
    an arm attached to the shuttle and biased against the first track, said arm being received and retained within said first slot when said shuttle is moved to said first position along said first track, and retained within said second slot when said shuttle is moved to said second position along said first track.

6. An apparatus for retaining a card in a computer having a frame, the card having an electrical connector for engaging a motherboard connector in the computer, the card also having two oppositely facing sides and a first edge, the apparatus comprising a card guide having an upper panel and a lower panel which define a channel therebetween for receiving the first edge of the card, the channel moveable between a first position disengaged with the card to a second position engaged with the card and further including a wall having an upper panel and a lower panel which define a channel therebetween for receiving the first edge or sides of the card, said wall being pivotally attached to said enclosure frame for rotating said channel between said first position away from and out of a plane of the card and said second position engaged with the card.

7. The apparatus of claim 6 wherein said lower panel includes a guiding surface formed at an oblique angle with respect to said upper panel.

8. A method for retaining a card within a computer frame chassis having a plurality of fixed connectors, said card having a plurality of edges, one of said edges including an electrical connector, said method comprising:
    first engaging the electrical connector of the card with at least one of the plurality of the fixed connectors within the computer frame chassis; and
    then moving a card guide in a direction parallel to one of the plurality of edges to engage that edge of the card.

9. The method of claim 8, wherein the step of moving the card guide into engagement with at least one of the card edges includes:
    sliding the card guide along a track between a first, disengaged position to a second engaged position with the card edges.

10. A method for retaining a card within a computer frame chassis having a plurality of fixed connectors, said card having a plurality of edges, one of said edges including an electrical connector, said method comprising:
    first engaging the electrical connector of the card with at least one of the plurality of the fixed connectors within the computer frame chassis; and
    then moving a card guide into engagement with at least one of the edges of the card by pivoting the card guide between a first, disengaged position out of a plane of the card to a second engaged position with the card sides.

11. A computer, comprising in combination:
    an enclosure having a frame;
    a motherboard connector located within the enclosure;
    a card having an electrical connector for engaging the motherboard connector, two oppositely facing sides, a first edge and a second edge with a back bracket for mounting the second edge to the frame; and
    a card guide having means for engaging the first edge of the card, said means including an upper panel and a lower panel which define a channel therebetween for receiving the first edge of the card, the means being moveable in a direction parallel to the first edge between a first position disengaged from the first edge of the card and a second position engaged with the first edge of the card.

12. The computer of claim 11, further including locking means for releasably retaining said engaging means in either the first position or the second position.

13. The computer of claim 11 wherein the means for engaging the first edge of the card includes:
    a track fixed to the frame and running substantially parallel to the first edge of the card; and a shuttle having an upper panel and a lower panel which define a channel therebetween for receiving the sides and the first edge of the card, and a shoulder slidingly engaged with said track for guiding the shuttle along the track between said first position and said second position.

14. The computer of claim 13 wherein said lower panel includes a guiding surface formed at an oblique angle with respect to said upper panel.

15. The computer of claim 13, further including a second track fixed to the frame in substantially parallel relation to said track, said shuttle including a second shoulder slidingly engaged with said second track.

16. The computer of claim 13, further including locking means for releasably retaining said shuttle in either the first position or the second position along the track, said locking means including:

a first slot and a second slot spaced apart along the length of the track; and an arm attached to the shuttle and biased against the track, said arm being received and retained within said first slot when said shuttle is moved to said first position along said track, and retained within said second slot when said shuttle is moved to said second position along said track.

17. A computer, comprising in combination:

an enclosure having a frame;

a motherboard connector located within the enclosure;

a card having an electrical connector for engaging the motherboard connector, two oppositely facing sides, a first edge and a second edge with a back bracket for mounting the second edge to the frame; and a card guide having means for engaging the first edge of the card, said means including an upper panel and a lower panel which define a channel therebetween for receiving the first edge of the card, the means being moveable between a first position disengaged from the first edge of the card and a second position engaged with the first edge of the card and further including a wall having an upper panel and a lower panel which define a channel therebetween for receiving the first edge of the card, said wall being pivotally attached to said enclosure frame for rotating said channel between said first position away from and out of a plane of the card and said second position engaged with the card.

18. The computer of claim 17 wherein said lower panel includes a guiding surface formed at an oblique angle with respect to said upper panel.

* * * * *